United States Patent [19]

McCanny et al.

[11] Patent Number: 5,200,914
[45] Date of Patent: Apr. 6, 1993

[54] WAVE DIGITAL FILTER WITH FINE GRAINED PIPELINING

[75] Inventors: John V. McCanny, Newtownards, United Kingdom; Rajinder Jit Singh, Ipoh, Malaysia; Roger F. Woods, Belfast, United Kingdom

[73] Assignee: Queens University of Belfast, Northern Ireland

[21] Appl. No.: 679,324

[22] Filed: Apr. 2, 1991

[30] Foreign Application Priority Data

Apr. 3, 1990 [GB] United Kingdom ............... 9007521

[51] Int. Cl.$^5$ .............................................. G06F 15/31
[52] U.S. Cl. ............................................. 364/724.14
[58] Field of Search ................................... 364/724.14

[56] References Cited

U.S. PATENT DOCUMENTS

| | | | |
|---|---|---|---|
| 3,919,671 | 11/1975 | Fettweis et al. | 364/724.14 |
| 3,967,099 | 6/1976 | Fettweis | 364/724.14 |
| 4,192,008 | 3/1980 | Mandeville | 364/724.14 |
| 4,716,537 | 12/1987 | Scheuermann | 364/724.14 |
| 4,827,443 | 5/1989 | Meerkotter et al. | 364/724.14 |

FOREIGN PATENT DOCUMENTS 2218545 11/1989 United Kingdom .

OTHER PUBLICATIONS

IEE Proceedings-G, vol. 136, No. 3, Jun. 1989 pp. 121-125 S. S. Lawson et al: "Improved 2-port systolic adaptor for wave digital filters".
Proceedings of the IEEE, vol. 72, No. 7, Jul. 1984 pp. 867-884 S. Y. Kung: "On supercomputing with systolic/wavefront array processors".

*Primary Examiner*—David H. Malzahn

[57] ABSTRACT

A wave digital filter implements a pipelining strategy to significantly increase the processing speed of circuits. The implementation allows high frequency digital signals to be processed at higher speeds than were previously possible. The implementation overcomes potential hardware limitation of wave digital filters and allows pipelining to be applied without introducing delays into the feedback loops. In particular, the implementation teaches how to increase the processing speed of a two port adaptor which is commonly used in the construction of wave digital filters.

10 Claims, 4 Drawing Sheets

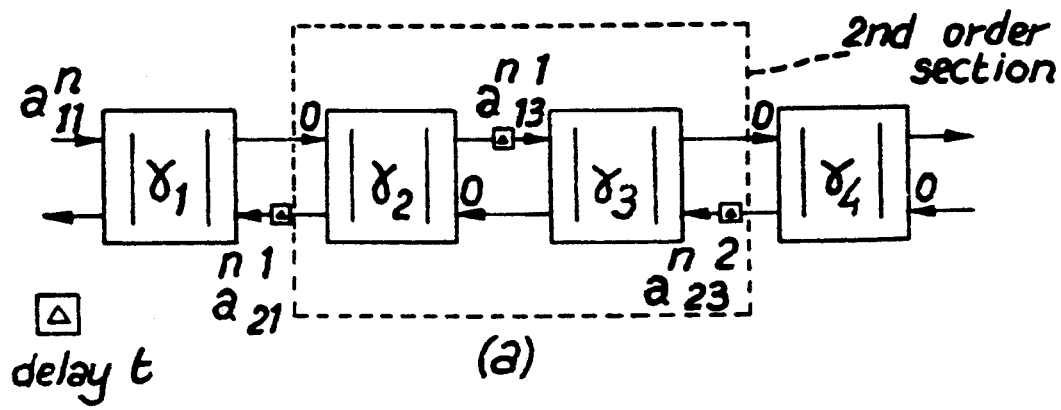
(a)
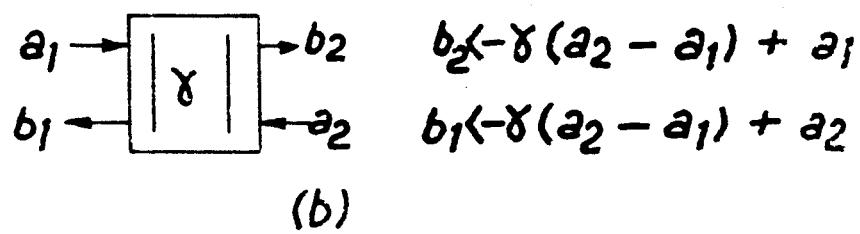
(b)
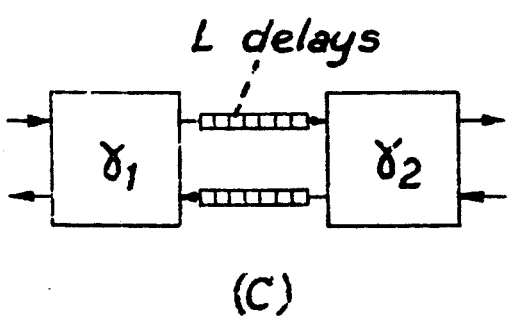
(C)
_FIG. 1_

WAVE DIGITAL FILTER WITH FINE GRAINED PIPELINING

This invention relates to signal processors and more specifically but not exclusively the invention relates to a signal processor which acts as a filter, in particular which acts as a Wave Digital Filter (WDF).

Wave digital filters (WDF) are a type of digital filter and offer particularly advantageous features over other types of digital filter. For example WDFs have very good stop band and pass band characteristics. These characteristics are particularly sensitive to small variations in coefficient values and offer a high degree of tolerance to non linear effects introduced by signal truncation and coefficient quantisation. The fact that WDFs have crisp cut-off thresholds makes them attractive for use in equipment used in speech processing and recognition.

Over recent years there have been a number of investigations into the VLSI implementations of WDFs. These have included designs which include bit serial as well as bit parallel architectures. However a problem suffered by WDFs, because of their recursive nature is that despite their attractive properties they have not been able to be used in high frequency, broad bandwidth equipment. This has limited the potential of such circuits, with the result that most WDFs designed to date have tended to be for low band-width applications such as speech processing and sonar. Typically WDFs would be very well suited as digital filters in broad-band width digital equipment such as high definition TV (HDTV). The main reason why the WDF has not been fully exploited is because during the digital processing it is necessary to obtain a previous value in order to compute a subsequent value One method which is being used to speed up the sampling rate of WDF is to employ pipelining. Often pipelining is performed down to the bit level. However, this technique of pipelining can be a problem in recursive digital filters since it introduces delays into feedback loops. To some extent these delays can be accommodated in bit serial processors where the number of cycles between samples is of the order of the word length. However, it represents a major limitation in parallel systems where the sampling rate and clock rate are the same. Here the potential sampling rate must be reduced by a factor of L where L is the number of delays introduced into the feed back loops. Consequently a bottle neck is introduced in the process which has severly limited the use of WDFs in broad band-width filters.

A similar problem has been tackled in respect of Infinite Impulse Response filters (IIR) in published UK Patent 2218545A, in which the processor disclosed calculates in the order of most significant bit (MSB) to least significant bit (LSB). However, the IIR filter despite the improvement described in the aforementioned published Patent Application is limited in use and cannot be used in applications where there is a high sensitivity to coefficient word-length.

The problem with pipelining the recursive computations in the processor can be illustrated by considering the effects of introducing L pipeline delays into a single two-port adaptor of an array of a typical Unit Element Wave Digital Filter (UEWDF). The introduction of L delays into a feedforward path must be compensated by the introduction of a similar number of delays in the reverse direction, in order to maintain correct circuit timing. This implies a circuit sampling period equal to $\frac{1}{L}$ samples per second. Implementation of conventional pipeline shift-and-add multiply array will result in a system in which the value of L (the latency) is equal to P+1 delays, where P is the signal word length. The use of conventional pipelining in such circuits as UEWDFs or WDFs can therefore significantly reduce their potential operating speed, particulartly in systems with long word lengths.

It is an object of an embodiment of the present invention to provide a Wave Digital Filter which can operate up to a throughput rate of 100 MHz and wherein the latency of the processor is independant of word length.

According to the present invention there is provided a signal processor which comprises a plurality of sub-processors each having an associated input cell for providing a difference data signal representative of the difference between a first input data signal and a second input data signal appearing at input ports of the input cell; each sub-processor further comprising a plurality of sub-cells which are arranged in groups to receive the first input data signal, the second input data signal and the difference data signal simultaneously and in parallel from the input cell associated with the sub-processor; the sub-cells having sub-sub-cells arranged to multiply the difference data signal by a filter coefficient so as to provide a product data signal, and to perform one or more predetermined arithmetic functions on the product data in accordance with a predetermined number system so as to provide emergent data which may be of at least two different data types and to transmit the emergent data according to its type to at least one different sub-cell of a different sub-processor during a subsequent clock pulse, the subsequent sub-cell or sub-cells into which the emergent data is transmitted being determined by the type of data generated during a previous clock cycle the subsequent sub-cells having sub-sub-cells which are arranged to perform predetermined arithmetic functions on the data; and the processor further comprising a plurality of output cells having first and second output ports so as to provide first and second output data signals representative of the filtered first and second input data signals, the output data signals being provided by the sub-cells, of a sub-processor in accordance with the particular sequence of arithmetic functions performed and the filter coefficients input to said sub-cells.

Preferably, means are provided to determine the type of data generated during the previous clock cycle. These may be in the form of sub-sub-cells, which are disposed within sub-cells.

Preferably the first and second inputs are represented using a radix two signed binary number representation (SBNR) and the filter coefficient, which is preferably positive, is represented in the form of an unsigned binary number.

The number of input cells of a processor correspond to a word length of the input data to be filtered. For example four input cells would enable manipulation of a four digit word. The processor comprises an array of multiply and/or add sub-cells arranged so that computation of input data is performed on the most significant bit of an input word before computation is performed on the least significant bit (LSB) of the word. Preferably the word length is sixteen bits.

By envisaging the processor as a two dimensional array of sub-processor cells, each sub-processor cell comprising a line of five sub-cells with adjacent subprocessors being offset from one another by one sub-cell, it becomes clearer to see how partial products from each sub-cell are right-shifted in respect of the previous row so as to ensure that a data output, which is in the form of a signed binary number, is of the correct order of significance and is manipulated with data of the correct significance of a subsequent sub-sub-cell.

Preferably the sub-processor cells comprise five different types of sub-cells. At any one time the computations performed within each of these sub-cells may be considered in isolation from a neighbouring sub-cell, as described with reference to FIG. 2 below.

The filter coefficient $\gamma$ (gamma) may lie within the range minus 1 to plus 1. Preferably, however the filter coefficient $\gamma$ (gamma) is restricted to being greater than zero and less than one. This may be achieved in practice by including a multiplexer in each input-cell so as to allow input lines to be exchanged in cases where $\gamma$ (gamma) is negative.

An embodiment of the present invention will now be described by way of an example only and with reference to the accompanying figures in which:-

FIG. 1 shows diagramatically a two port adaptor;

FIG. 1 shows a diagramatical representation of a unit element wave digital filter (UEWDF). The UEWDF is shown in FIG. 1a. This consists of a cascade of $n+1$ two port adaptors with $t/2$ delays on each interconnecting branch. Here N is the order of the filter and T the sampling period.

In FIG. 1a a wave (Digital Sequence) incident on the ith port of adaptor J is labelled $a_{IJ}$, whilst those reflected from port I of adaptor J are represented by the $b_{IJ}$. The ith order filter in FIG. 1 can be regarded as a cascade of so-called second order sections of the type enclosed in the dotted lines each of these comprises of a pair of adaptors and at any one time computations performed within one of these units can be considered in isolation from a neighbouring pair. This localises the problem of feed back loops to one of these sections. The equations which describe the computations within such a section are given. In the first half of a sampling period the first adaptor computes:

$$a_{11}{}^n + \gamma(a_{21}{}^{n-1} - a_{11}{}^n) = b_{21}{}^n$$

$$a_{21}{}^{n-1} + \gamma(a_{21}{}^{n-1} - a_{11}{}^n) = b_{11}{}^n \quad (1)$$

On the second half of the sampling period the second adaptor computes:

$$a_{12}{}^n + \gamma(a_{22}{}^{n-1} - a_{12}{}^n) = b_{22}{}^n$$

$$a_{22}{}^{n-1} + \gamma(a_{22}{}^{n-1} - a_{12}{}^n) = b_{12}{}^n \quad (2)$$

In the above it is assumed that $j=1$ in the case of the first adaptor and $j=2$ in the case of the second adaptor. The superscript n refers to the current sample period whilst $n-1$ refers to the previous one. The value $\gamma$ denotes the filter coefficient which in general lies within the range $-1 < \gamma < 1$. FIG. 1(b) illustrates the function of each unit within a 'second order section'—namely the two port adaptor. Its inputs and outputs are labelled $a_1$ and $a_2$ and $b_2$ respectively.

The problem of pipelining the recursive computations described by equations (1) and (2) can be illustrated by considering the effects of introducing L pipeline delays into the schematic circuit shown in FIG. 1c. In accordance with the "cut theorem", the introduction of L delays into the feed-forward path of FIG. 2 must be compensated by the introduction of a similar number of delays in the reverse direction, in order to maintain correct circuit timing. This in turn implies a circuit sampling period equal to $\frac{1}{2}L$ samples per second. Implementation of the circuit in FIG. 1c using, for example, a conventional pipelined shift and add multiplier array will result in a system in which the value of L (the latency) is equal to $p+1$ delays, where p is the signal wordlength. The use of conventional pipelined circuits in the construction of WDFs can therefore significantly reduce their potential operating speed, particularly in systems with long word lengths.

Figure 2:
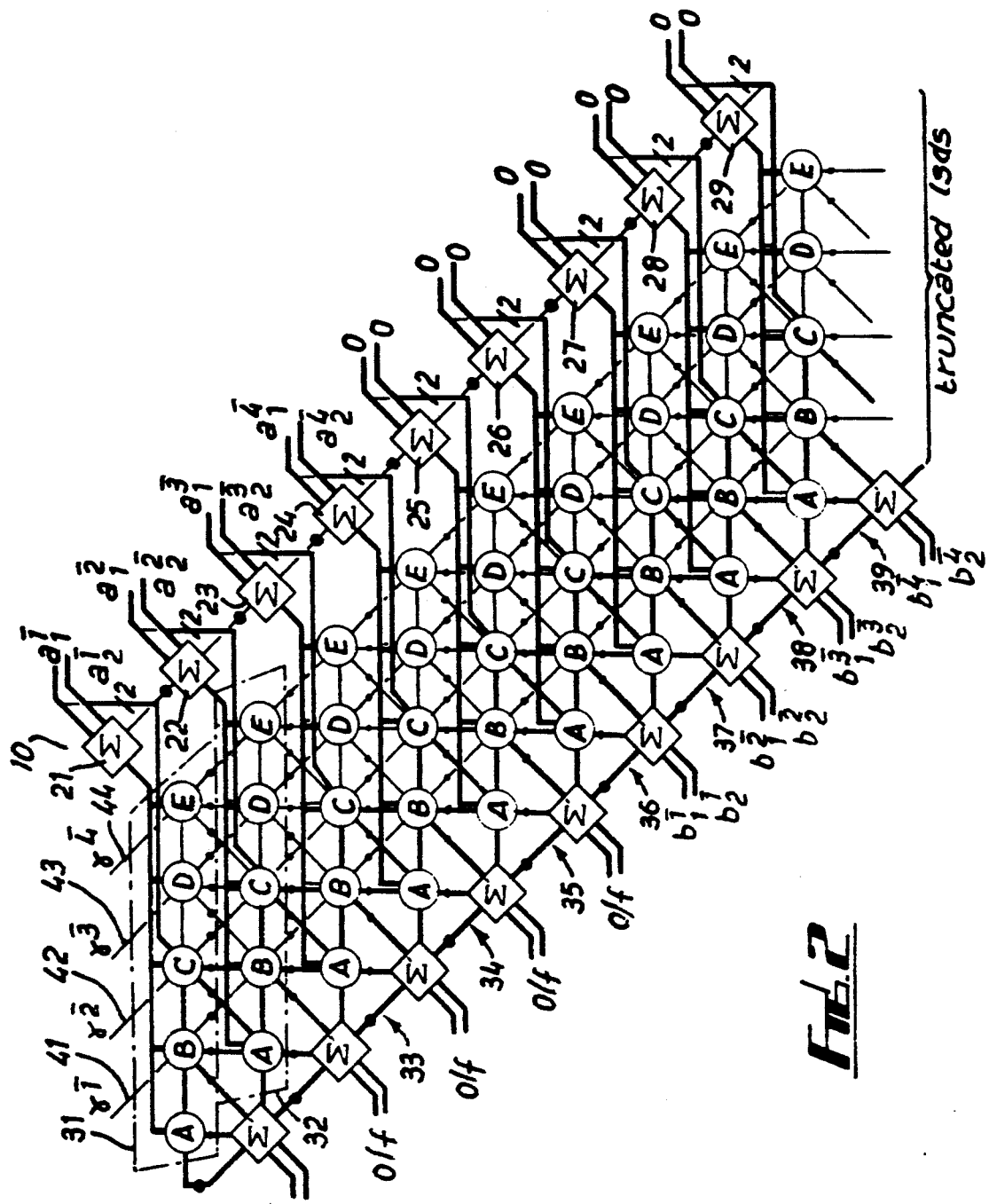
FIG. 2 shows a diagramatical representation of a processor circuit used within a Wave Digital Filter.

FIG. 2 shows a processor which has nine input cells 21 to 29 in which the difference between a first input data signal $a_1$ and a second input data signal $a_2$ is computed. Each input data signal is a signed binary digit in accordance with a predetermined protocol such as radix 2. Individual data bits with subscript 1 are constituent bits of a first data word and bits with subscript 2 are from a second data word. For purposes of clarity in FIG. 1 the input data signals $a_1$ and $a_2$ are provided with a superscript which is indicative of the significance of each data bit, when assembled together in its respective data word. That is to say, a data bit with a superscript $\bar{1}$ indicates that the data bit is the most significant bit (MSB) of its data word. It is important that when performing arithmetic functions such as addition or multiplication, that bits of equivalent significance are manipulated together by an appropriate processor cell.

Figure 3:
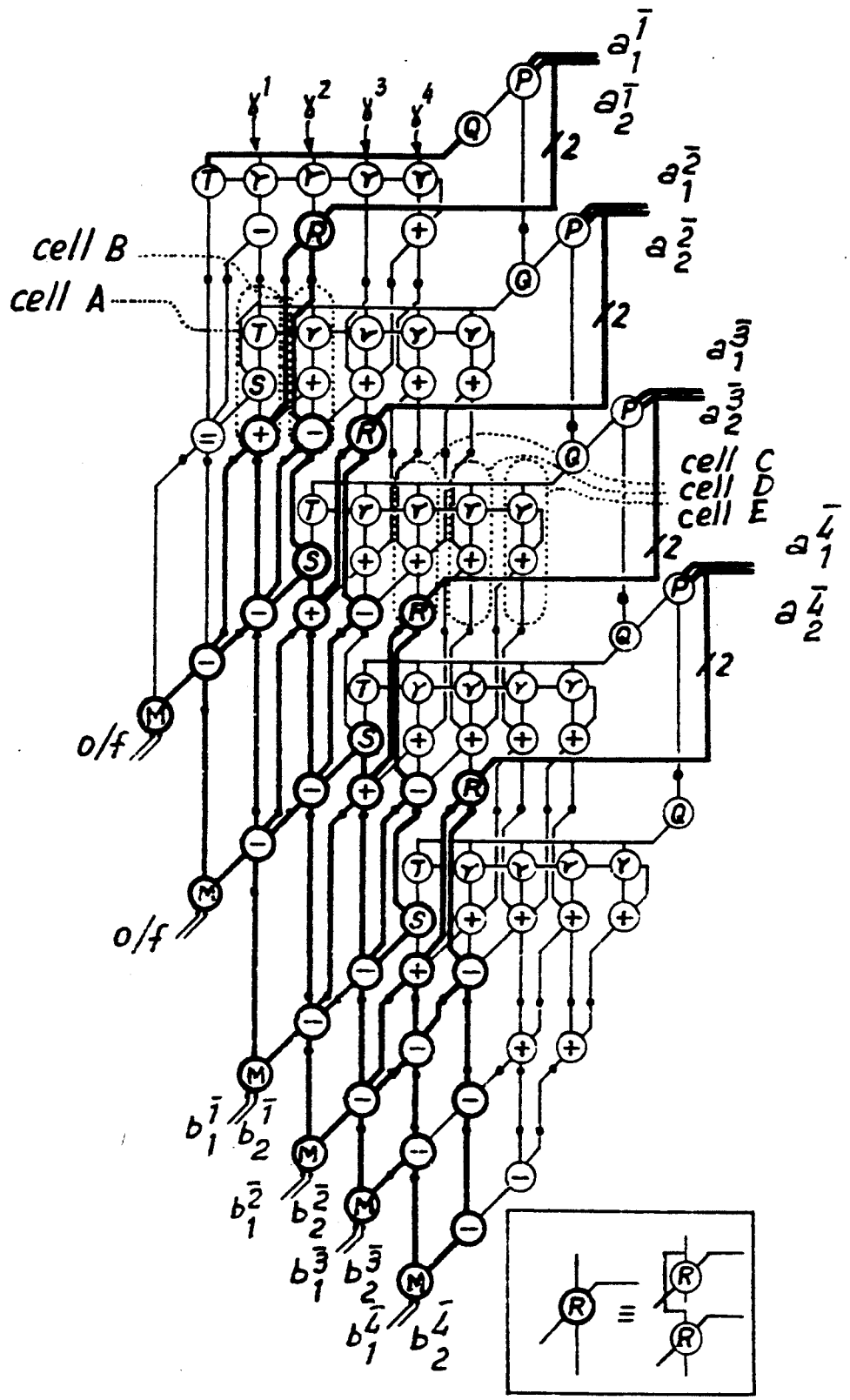
FIG. 3 shows a detailed diagramatical circuit of the two port adaptor array at a sub-cell level.
Figure 4:
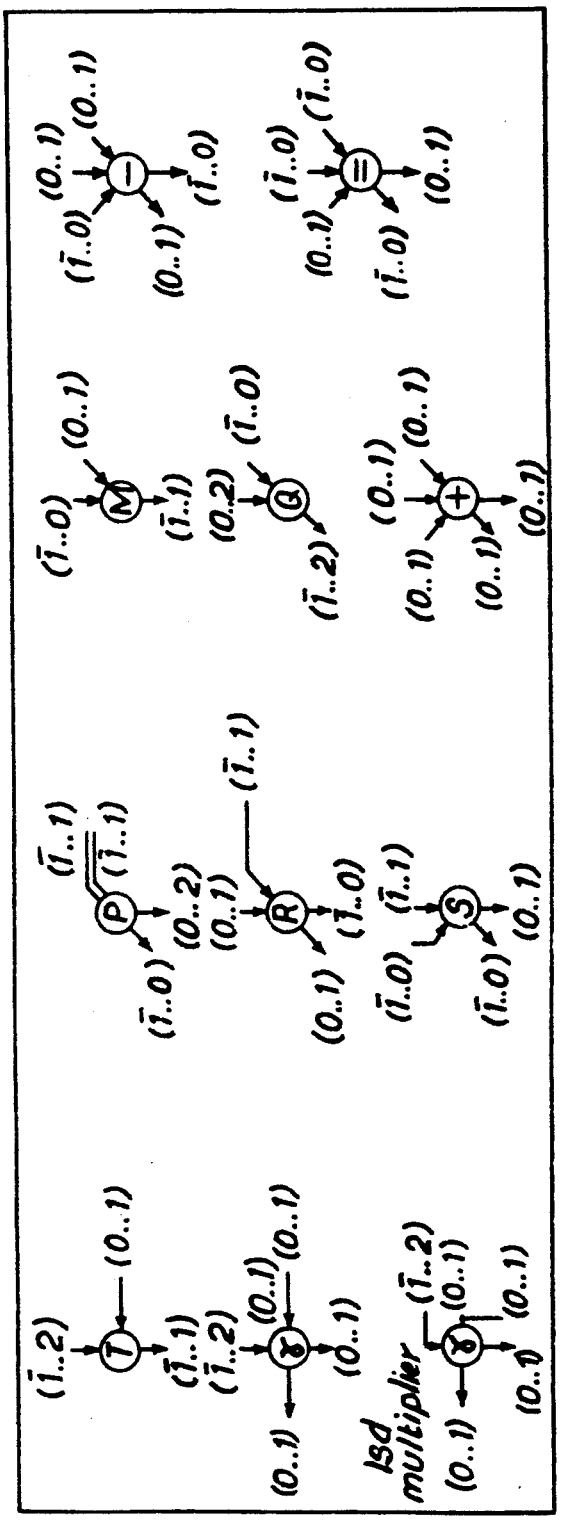
FIG. 4 illustrates diagramatically functions of different types of sub-sub-cells of FIGS. 2 and 3.

The difference between each of the two input data bits $a_1$ and $a_2$, is broadcast into a sub-processor 31, 32. . . . Each input cell 21 has an associated sub-processor 31. Sub-processor 31 comprises five sub-cells 31A, 31B, 31C, 31D and 31E. It is the sub-cells which manipulate data bits and it is sub-sub-cells, as shown in FIGS. 3 and 4 which perform individual arithmetic calculations on each data bit. Filter coefficients $\gamma$ are input to each sub-processor on respective lines 41, 42, 43 and 44. There are four filter coefficients having the same superscript notation as input data to indicate the significance of each bit of a word.

Subprocessors 31 to 39 are arranged such that data passing from one sub-processor to a subsequent sub-processor will be automatically left shifted so that a generation of a partial product within any particular sub-cell of a sub-processor will be correctly output into the subsequent sub-cell of the subsequent subprocessor such that the subsequent sub-cell is of the correct significance. By manipulating the most significant bit first and by implementing a redundant number system the problem of carry propagation delays of partial products between sub-processors is removed.

FIG. 3 shows the circuit of FIG. 2 with details of the sub-sub-cells. A C cell is similar to a D cell but also comprises two separate sets of additional R sub-sub-cells which allow the results of an intermediate binary partial product to be added in parallel to incoming SBNR digits from the words $a_1$ and $a_2$ respectively. The limits required on the inputs and outputs of this and other sub-subcells is illustrated in FIG. 4. For simplicity the emergent lines of the input cell 21 have been represented in bold lines. A similar notation has been used to represent the accumulated result digits as they are formed in the middle of an array. A single bold line to subcell R, as shown in FIG. 2 has also been included. The addition performed in subcell C leads to the generation of transfer digits which also must be accumulated to form the output result. The subcells B therefore also incorporate a pair of additional subtractor sub-sub-cells in order to accomodate this. The function of the sub-sub-cells A along the most significant edge of the main array is to allow for the case where a digit from the subtraction $(a_2-a_1)$ occurring at the input cell 21 has the value $\bar{1}$ (or $-1$) or 2. In the case where $(a_2-a_1)$ is negative a digit having the value $\bar{1}$ must be generated in this position. In the case where $(a_2-a_1)$ has the value 2 then the most significant bit of $\gamma$ must be left shifted by one into this cell position. The sub-cell A therefore consists of a T sub-sub-cell which handles these two possibilities and an S sub-sub-cell which adds the SBNR output from the T sub-sub-cell from the previous sub-processor. The same operation could of course be achieved by allowing $\gamma$ to have a 2s complement value. However by avoiding the use of the 2s complement value the circuit design is slightly simpler and avoids any additional generation of transfer digits at the most significant bit end of the array, which would otherwise increase circuit latency. The input cells 21 decompose into two sub-sub-cells P and Q. The function of the first is to perform a parallel subtraction of the two SBNR input words $a_1$ and $a_2$. The function of the Q sub-subcell then merges the incoming sum digit from the subsequent row of higher significance and the transfer digit from P sub-sub-cell in the same row to produce an output in the range $\bar{1}$ to 2. By limiting the output to this range the logic is required to implement the multiplied sub-sub-cells, used in the main array is significantly simplified. Accumulator circuits on the output of the array similarly decompose into two pairs of full subtractor sub-sub-cells plus a pair of merged sub-sub-cells M which produce output $b_1$ and $b_2$ with the same limits as those required on the ports of the next adaptor. It will be observed that it takes a total of five pipeline delays, indicated diagramatically by the presence of a black circular dot, before the most significant digits of the output words (ie. $b_1$ and $b_2$) emerge from the array and that this is independant of the word length. The latency of the system is therefore five cycles and is independant of input word length. This situation contrasts with processors which perform operations in the order of least significant bit first and most significant bit last. It will also be noted that since the circuit does not have to compute partial products involving least significant digits it is not necessary to include cells to do this.

FIG. 3 shows the situation where cells have been omitted. The latency of the two port adaptors in FIG. 3 is determined by two factors. The first is the on-line delay involved in the parallel multiply-and-add preparations computed by the circuit. The second is the number of additional bits/digits required at the most significant end of the output to accomodate word growth. In this case the value of the latency is slightly greater than that described in UK Patent Application 2218545A for the IIR filter circuit. This reflects the fact that the computations involved are more complex. For the purposes of the example considered $\gamma$ has been chosen to be greater than zero and less than one half. The five cycle latency of the circuit of FIG. 2 is a consequence of inserting pipeline delays along every row of the circuit. A circuit which operates every cycle can be obtained by inserting pipeline delays every five rows rather than every one row. The sampling rate of the circuit will thus be determined by the settling down time for computations within these rows estimated at 35 gate delays. With current sub-micron CMOS technology this enables impressive throughput rates to be obtained, which for larger word lengths would be significantly greater than that of non-pipelined systems. The circuit uses most significant bit rather than least significant bit computation methods and does not suffer from a degradation in the sampling rate as word length increases.

FIG. 4 shows diagramatically functions performed by sub-sub-cells as referred to above and is self explanatory with reference to the above and FIGS. 2 and 3.

It will be appreciated that the above is one embodiment and that variation may be made to the invention without departing from the scope of the invention.

We claim:

1. A wave digital filter for filtering input data comprising:

a plurality of input cells which are operative for receiving a first input data signal and a second input data signal and outputting a difference data signal representing the difference between said second input data signal and said first input data signal;

a sub-processor associated with each input cell, each sub-processor comprising a plurality of sub-cells which are arranged in groups to receive said first input data signal, said second input data signal and said difference data signal simultaneously and in parallel from the input cell associated therewith, said sub-cells comprising a plurality of sub-sub-cells wherein selected sub-cells have multiplier sub-sub-cells which are operative for multiplying said difference data signal by a filter coefficient signal and providing a product data signal representative of said multiplication, said sub-cells further including an additional sub-sub-cell which receives said product data signal and is operative for performing at least one predetermined arithmetic function to said product data signal in accordance with a predetermined number system, and providing a first emergent data signal representative of said arithmetic function, said first emergent data signal being one of least two different data signal types, said additional sub-sub-cells transmitting said first emergent data signal according to said type to at least one different sub-cell of a different sub-processor during a subsequent clock pulse, said at least one different sub-cell into which said first emergent data signal is transmitted being determined by the type of emergent data signal generated during a previous clock cycle, said at least one different sub-cell having further sub-sub-cells which are operative for performing aa further predetermined arithmetic function on said first emergent data signal and providing a second emergent data signal; and an output cell associated with each sub-processor, each output cell receiving said second emergent data signal from predetermined arithmetic sub-sub-cells in accordance with a predetermined sequence of arithmetic functions performed and the filter coefficient input to each sub-cell, each output cell having first and second output ports for outputting first and second output data signals representative of said first and second input data signals as filtered by said sub-processors.

2. The wave digital filter of claim 1 further comprising means for determining the type of emergent data signal generated during the previous clock cycle.

3. In the wave digital filter of claim 2, said means comprising sub-sub cells within said sub-cells.

4. In the wave digital filter of claim 1, said first and second input data signals being represented using a radix 2 signed binary number representation, said filter coefficient being represented in the form of a two's complement number.

5. In the wave digital filter of claim 4, said filter coefficient being positive.

6. In the wave digital filter of claim 1, said input data having a predetermined word length, said plurality of input cells corresponding to said word length.

7. In the wave digital filter of claim 1, said input data including a most significant bit and a least significant bit, said sub-cells being arranged so that the filtering of input data is performed on the most significant bit of an input word before filtering is performed on the least significant bit.

8. In the wave digital filter of claim 1, said sub-processors comprising five sub-cells.

9. In the wave digital filter of claim 1, said filter coefficient being in the range of plus one to minus one.

10. In the wave digital filter of claim 9, said filter coefficient being in the range of greater than zero and less than one.

* * * * *